United States Patent
Yahav et al.

(10) Patent No.: US 6,794,628 B2
(45) Date of Patent: Sep. 21, 2004

(54) SOLID STATE OPTICAL SHUTTER

(75) Inventors: Giora Yahav, Haifa (IL); Gavriel J. Iddan, Haifa (IL)

(73) Assignee: 3DV Systems, Ltd., Yokneam (IL)

( * ) Notice: Subject to any disclaimer, the term of this patent is extended or adjusted under 35 U.S.C. 154(b) by 0 days.

(21) Appl. No.: 10/210,277

(22) Filed: Jul. 31, 2002

(65) Prior Publication Data

US 2002/0185590 A1 Dec. 12, 2002

Related U.S. Application Data

(62) Division of application No. 09/402,854, filed as application No. PCT/IL97/00120 on Apr. 8, 1997.

(51) Int. Cl.[7] ............................................... H01J 40/14
(52) U.S. Cl. ................................... 250/214 R; 327/514
(58) Field of Search ..................... 250/214.1, 214 LS, 250/214 R, 237 R, 216; 327/514, 515; 310/303

(56) References Cited

U.S. PATENT DOCUMENTS 3,748,480 A  *  7/1973  Coleman ................ 250/214 R
3,852,797 A  * 12/1974  Lebailly et al. ............... 257/85
5,237,233 A       8/1993  Conley
5,256,913 A      10/1993  Sommer
5,510,665 A       4/1996  Conley
5,949,064 A       9/1999  Chow et al.
6,483,094 B1 * 11/2002  Yahav et al. ............ 250/214 R

FOREIGN PATENT DOCUMENTS

WO      WO 97/01111      1/1997
WO      WO 97/01112      1/1997
WO      WO 97/01113      1/1997

OTHER PUBLICATIONS

Patent Abstracts of Japan, Apr. 16, 1981, vol. 005, No. 055 (E–052) and JP 56–006482A, Fujitsu Ltd., Jan. 23, 1981.
Patent Abstracts of Japan, Aug. 2, 1983, vol. 007, No. 174 (E–190) and JP 58–080881A (Mitsubishi, Denki KK), May 16, 1983.

* cited by examiner

Primary Examiner—Stephone B. Allen
(74) Attorney, Agent, or Firm—Fenster & Company

(57) ABSTRACT

A method of producing an optoelectronic circuit comprising: forming a first optoelectronic element of the circuit on a first surface of a semiconductor substrate; forming a second optoelectronic element of the circuit on a second surface of the semiconductor substrate; and wherein the first and second optoelectronic elements communicate via current transmitted through the substrate.

5 Claims, 4 Drawing Sheets

SOLID STATE OPTICAL SHUTTER

RELATED APPLICATIONS

The present application is a divisional of U.S. patent application Ser. No. 09/402,854 filed on Jan. 3, 2000, which is a national stage of PCT Application No. PCT/IL97/00120 filed on Apr. 8, 1997, the disclosures of which are incorporated herein by reference.

FIELD OF THE INVENTION

The present invention relates generally to optoelectronic devices, and specifically to high-speed shutters for image and optical data modulation.

BACKGROUND OF THE INVENTION

Optoelectronic shutters are well known in the art. Such shutters open and shut in response to an electrical waveform or pulse applied thereto, generally without moving mechanical parts. They are used, inter alia, in high-speed image capture applications, for which mechanical shutters are typically too slow. Optoelectronic shutters known in the art include liquid crystal shutters, electrooptical crystal shutters and gated image intensifiers.

Liquid crystal shutters are simple and inexpensive to manufacture. Their speed, however, is inherently limited to about 20 $\mu$sec switching time. Moreover, in their open state, liquid crystal shutters typically transmit only about 40% of the light incident thereon, whereas in their closed state, they still transmit at least 0.1% of the incident light.

Electrooptical crystal shutters can be switched quickly, on the order of 0.1 nanosecond. They require a collimated light input, however, and have only a narrow acceptance angle within which they can shutter incident light efficiently. The crystals themselves are expensive, and costly, high-speed, high-voltage electronics are also needed to switch the shutters on and off at the rated speed.

Image intensifiers generally comprise an electron tube or microchannel plate, with a photoelectric photocathode input and a light-emitting phosphor-coated anode at the output. Gated intensifiers further include high-speed switching circuitry, which enables them to be gated on and off quickly, with typical switching times as fast as 1 nanosecond. For light to be effectively shuttered or amplified by the intensifier, it must be focused on the photocathode. Although intensifiers are manufactured in large quantities, the manufacturing process involves metal-to-glass vacuum sealing, which is complex, labor intensive and therefore costly. Partly as a result of this complexity, gated intensifiers tend to be large compared to their active area and are available in a very limited range of shapes and sizes.

SUMMARY OF THE INVENTION

It is an object of the present invention to provide a compact, high-speed, solid-state optoelectronic shutter, which may be manufactured at relatively low cost in large quantities.

In some aspects of the present invention, the shutter is used for modulating light that is received by an image capture device, such as a high-speed CCD camera.

In other aspects of the present invention, the shutter is used in modulating an image or an array of optically-encoded data, for example, in the framework of a system for optical data processing.

It is a further object of the present invention to provide a method for manufacturing the shutter.

In preferred embodiments of the present invention, an optoelectronic shutter comprises a generally planar substrate made of semiconductor material, having mutually substantially parallel input and output surfaces. A planar photodiode layer is formed on the input surface of the substrate, and a planar light-emitting diode (LED) layer is formed on the output surface, opposite the photodiode layer. A gate layer is formed intermediate the photodiode and LED layers, preferably adjacent the photodiode layer. Preferably, transparent, electrically conductive coatings, for example, indium tin oxide (ITO), are applied to at least a portion of each of the input and output surfaces. An additional biasing layer is preferably formed intermediate the gate and LED layers, for back-biasing the LED.

When light strikes the photodiode layer, photoelectrons are created. Ordinarily, when there is no voltage or only a relatively small voltage applied between the input and output surfaces, the electrons remain in the photodiode layer and recombine, as they are unable to pass the gate. Under these conditions, the shutter is closed.

To open the shutter, a control voltage, preferably in the range of 5 to 15 volts, is applied between the surfaces, to bias the LED positively with respect to the photodiode. In some embodiments of the invention, higher or lower voltages may be used. Preferably the voltage is applied to the conductive coating on the surfaces. This voltage creates a potential difference across the substrate, between the photodiode and the LED. In this state, photoelectrons that are produced in the photodiode pass through the gate and substrate to the LED layer, which emits light in response to the incident photoelectrons. This process continues until the control voltage is removed, whereupon the shutter closes.

Preferably, the substrate comprises silicon, GaAs, InP or other semiconductor material known in the art, preferably in the range of 0.5 to 2 mm thick and 1 to 40 mm across. More preferably, the substrate comprises a high-electron mobility, substantially single crystal of one of the above-mentioned materials, wherein the crystal is oriented so that one of the crystal axes is substantially perpendicular to the input and output surfaces. In this way, when the control voltage is on, photoelectrons emitted by the photodiode travel ballistically along the crystal axis perpendicular to the surfaces, generally without substantial scattering and without significant photoelectron divergence in directions other than perpendicular to the surface. Hence, a photon striking at any point on the input surface of the shutter and generating a photoelectron in the photodiode layer there will cause a photon to be emitted by the LED layer at a corresponding point on the output surface. As a result, if an image is focused onto the input surface, it will be reproduced at the output surface with minimal blurring or distortion.

The active aperture of the shutter, defined by the areas of the photodiode and LED, may be as large as 40 mm across and may be made circular, square or rectangular, depending on the application. Thus, shutters in accordance with the present invention are more compact and may have a substantially greater ratio of active aperture to thickness than high-speed shutters known in the art, such as gated intensifiers and electrooptical crystal shutters.

In some preferred embodiments of the present invention, the photodiode layer comprises an avalanche photodiode. Preferably, an additional transparent conductive layer is interposed between the photodiode layer and the gate, and a voltage preferably of between 20 and 100 volts is applied to this conductive layer so as to reverse-bias the avalanche diode. Each photon incident on the input surface that is absorbed by the photodiode layer will cause an "avalanche" of electrons, to be generated, as is known in the art. When the control voltage is applied, these electrons pass through the gate to the LED layer. Thus, shutters according to these preferred embodiments transmit images with enhanced efficiency and can even provide a modicum of image intensification.

In preferred embodiments of the present invention, the shutter is produced using methods of semiconductor device fabrication known in the art. After the substrate has been suitably cut and polished, the gate, photodiode and LED layers are preferably formed thereon by means of epitaxy, MOCVD and/or ion implantation. Electrical leads are then bonded to appropriate locations on the shutter, specifically to the input and output surfaces thereof, and the shutter is suitably packaged for its application.

It will be appreciated that shutters may be mass-produced in accordance with the principles of the present invention at substantially lower cost than high-speed shutters known in the art. Shutters in accordance with preferred embodiments of the present invention generally include only a single, solid-state component, largely comprising low-cost, readily-available materials. Fabrication of such shutters may be substantially automated. Shutters in accordance with preferred embodiments of the present invention may be made to operate at relatively low voltage: typically 5–10 volts, or at most 100 volts when an avalanche photodiode layer is used. Gated intensifiers known in the art generally require high voltage, typically at least 6,000 volts.

In some preferred embodiments of the present invention, a shutter as described above is used to modulate light input to an image capture device, such as a CCD camera. For example, the shutter may be used in image capture devices substantially as described in WO 98/39790, and particularly in camera systems for range-gated and three-dimensional distance-responsive imaging, as described in WO 97/01111, WO 97/01112 and WO 97/01113. All of these PCT patent applications are assigned to the assignee of the present patent application, and their disclosures are incorporated herein by reference. Light passing through the shutter may be focused onto an image detector, such as a CCD array. Alternatively, the shutter may be directly coupled to the image detector, for example, by attaching the shutter to a fiber-optic faceplate that is coupled to the detector, by fastening the shutter directly to the image detector surface or by using a relay lens.

In other preferred embodiments of the present invention, the shutter is used as a part of a system for optical computing. The shutter is used to switch or modulate simultaneously a matrix of optically-encoded data bits or an electronic image.

There is therefore provided, in accordance with a preferred embodiment of the invention, a solid-state optoelectronic shutter, comprising: a semiconductor material, having formed therein or thereon: a planar photodiode, having a planar surface, and optically communicating with the input; a planar LED layer, having a planar surface substantially parallel to the planar photodiode, and optically communicating with the output; and a planar gate layer, intermediate the planar photodiode and the planar LED.

Preferably, the substrate comprises substantially a single crystal, and wherein an axis of the crystal is oriented in a direction substantially perpendicular to the planar surfaces of the photodiode and the LED.

Preferably, the semiconductor material comprises a material selected from the group consisting of silicon, GaAs and InP.

In a preferred embodiment of the invention, the photodiode has a planar PIN structure. Alternatively, the photodiode comprises a planar avalanche photodiode. Preferably the shutter comprises a transparent, conductive layer between the photodiode and the gate layer, wherein an electrical potential is applied to the conductive layer to reverse-bias the photodiode.

Preferably, a control voltage is applied across the gate layer so as to permit electrons to flow therethrough, from the photodiode to the LED, thereby opening the shutter.

In a preferred embodiment of the invention, the semiconductor material is comprised in a generally planar substrate having input and output faces. Preferably, the shutter comprises first and second transparent, conductive coatings on the input and output faces, respectively, wherein the control voltage is applied between the first and second coatings. Preferably the shutter further includes metal coatings on peripheral portions of the input and output faces, wherein the metal coatings are electrically coupled to the transparent, conductive coatings for application of the control voltage therethrough.

In a preferred embodiment of the invention, the planar photodiode is proximate the input face. Alternatively or additionally, the planar LED is proximate the output face.

In a preferred embodiment of the invention the planar photodiode, the gate layer and the planar LED are formed proximate one of the input and output faces. Preferably, the substrate is thinned between the formed planar devices and the other face.

In a preferred embodiment of the invention at least one of the faces is a face of semiconductor material epitaxially grown on the substrate and wherein at least one of the planar photodiode and the planar LED is formed in the epitaxially grown material.

There is further provided, in accordance with a preferred embodiment of the invention, an optical shutter comprising a photodiode which receives light an produces charge carriers; an LED which receives the charge carriers and produces light responsive to the carriers; and a gate which gates the flow of carriers from the photodiode to the LED. Preferably the shutter includes a semiconductor filled region, situated intermediate the photodiode and the LED, through which the charge carriers flow.

In a preferred embodiment of the invention, the semiconductor material comprises a material selected from the group consisting of silicon, GaAs and InP.

In a preferred embodiment of the invention, the photodiode has a PIN structure. Alternatively, the photodiode comprises an avalanche photodiode. Preferably the shutter comprises a transparent, conductive layer between the photodiode and the gate layer, wherein an electrical potential is applied to the conductive layer to reverse-bias the photodiode.

Preferably, a control voltage is applied across the gate layer so as to permit electrons to flow therethrough, from the photodiode to the LED, thereby opening the shutter.

There is further provided, in accordance with a preferred embodiment of the invention, a method for producing an optoelectronic device, comprising: providing a generally planar substrate made of semiconductor material, having input and output faces; producing a gate layer within the substrate between the input and output faces; producing a planar photodiode proximate the input face, external to the gate layer; and producing a LED proximate the output face, external to the gate layer.

Preferably, the method comprises depositing transparent, conductive coatings on the input and output faces. Preferably the method further includes depositing metal coatings on peripheral portions of the input and output faces, in electrical contact with the transparent, conductive coatings thereon. Preferably, the method further includes attaching electrical leads to the metal coatings, for applying a control voltage thereto.

In a preferred embodiment of the invention producing the gate layer comprises implanting ions in the substrate. Alternatively or additionally, producing the photodiode comprises doping the substrate to form a planar PIN structure therein. Alternatively or additionally producing the photodiode comprises forming an avalanche photodiode structure at the input face of the substrate. Preferably, the method includes producing a conductive layer intermediate the gate layer and the photodiode for applying a biasing voltage to the photodiode.

In a preferred embodiment of the invention, the photodiode is formed proximate the input face. Alternatively or additionally, the LED is formed proximate the output face.

In a preferred embodiment of the invention, the photodiode, the gate layer and the LED are formed proximate one of the input and output faces. Preferably, the method includes thinning the substrate between the formed photodiode, gate layer and LED and the other of the input and output faces.

There is further provided, in accordance with a preferred embodiment of the invention, an optoelectronic shutter produced according to the method described above.

There is further provided, in accordance with a preferred embodiment of the invention, an integrated image detection device, comprising: an optical detector array, having a front surface; and a shutter as described above, fixed to the front surface of the array so as to modulate light incident on the array through the shutter. Preferably, the output surface of the shutter is directly attached to the front surface of the array. Alternatively, the device comprises a faceplate, which conveys an optical image between first and second sides thereof, wherein the first side of the faceplate is attached to the output face of the shutter, and the second side of the faceplate is attached to the front surface of the array.

There is further provided, in accordance with a preferred embodiment of the invention, a method for producing an integrated imaging device, comprising providing an optoelectronic shutter as described above and fixing the shutter to a front surface of an optical detector array. Preferably, fixing the shutter to the front surface of the detector array comprises cementing the shutter to the surface. Alternatively, fixing the shutter to the front surface of the detector array comprises cementing a first side of a faceplate to the surface and cementing the shutter to a second side of the faceplate, opposite the first side and optically communicating therewith.

The present invention will be more fully understood from the following detailed description of the preferred embodiments thereof, taken together with the drawings in which:

DETAILED DESCRIPTION OF PREFERRED EMBODIMENTS

Figure 1:
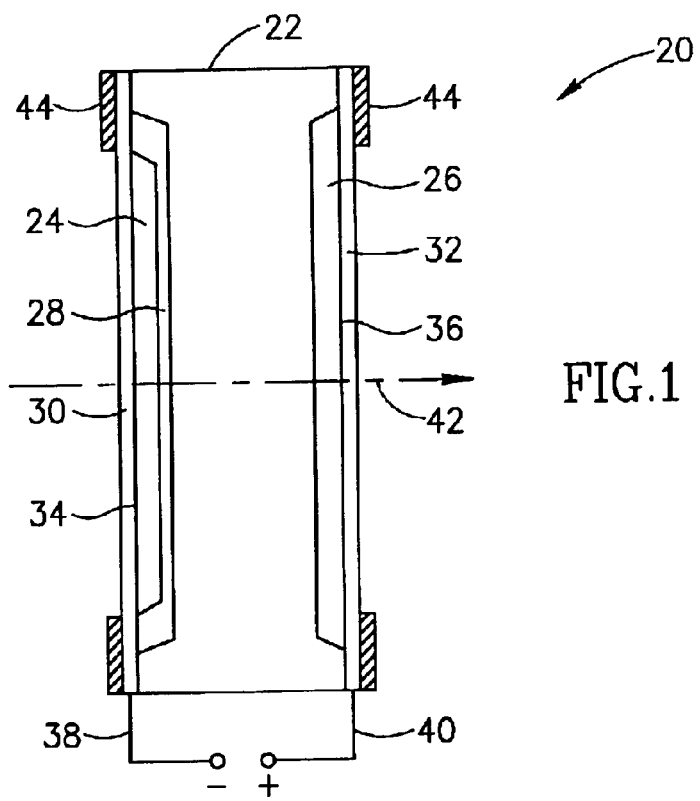
FIG. 1 is a schematic, sectional representation of an optoelectronic shutter, in accordance with a preferred embodiment of the present invention.

Reference is now made to FIG. 1, which is a schematic, sectional illustration showing a solid-state optoelectronic shutter 20, in accordance with a preferred embodiment of the present invention. Shutter 20 comprises a substrate 22 of semiconductor material, having an input surface 34 and an output surface 36. Preferably, substrate 22 comprises a substantially pure, single crystal of GaAs, silicon, InP or other suitable material known in the art. The crystal is oriented so that a crystal axis 42 thereof is substantially perpendicular to surfaces 34 and 36.

Within substrate 22, a planar gate layer 28 is produced below input surface 34, preferably by implantation of ions at an appropriate range of depths within substrate 20, using methods of semiconductor doping known in the art. A planar photodiode layer 24, preferably having a PIN structure, as is known in the art, is similarly produced between input surface 34 and gate layer 28. A planar light-emitting diode (LED) layer 26 is produced adjacent to output surface 36, opposite photodiode 24 and gate 28. An additional biasing layer (not shown in the figures), for back-biasing LED 26, is preferably produced intermediate LED layer 26 and gate 28, generally adjacent the LED layer.

Input surface 34 and output surface 36 are coated with layers 30 and 32, respectively, of transparent, conductive material, preferably comprising indium tin oxide (ITO), chemically deposited on the surfaces. Conductive metal coatings 44 are applied to peripheral portions of surfaces 34 and 36, in electrical contact with each of transparent, conductive coatings 30 and 32. Electrical leads 38 and 40 are connected to coatings 44, so as to apply triggering signals to coatings 30 and 32, respectively, as described below.

Figure 5:
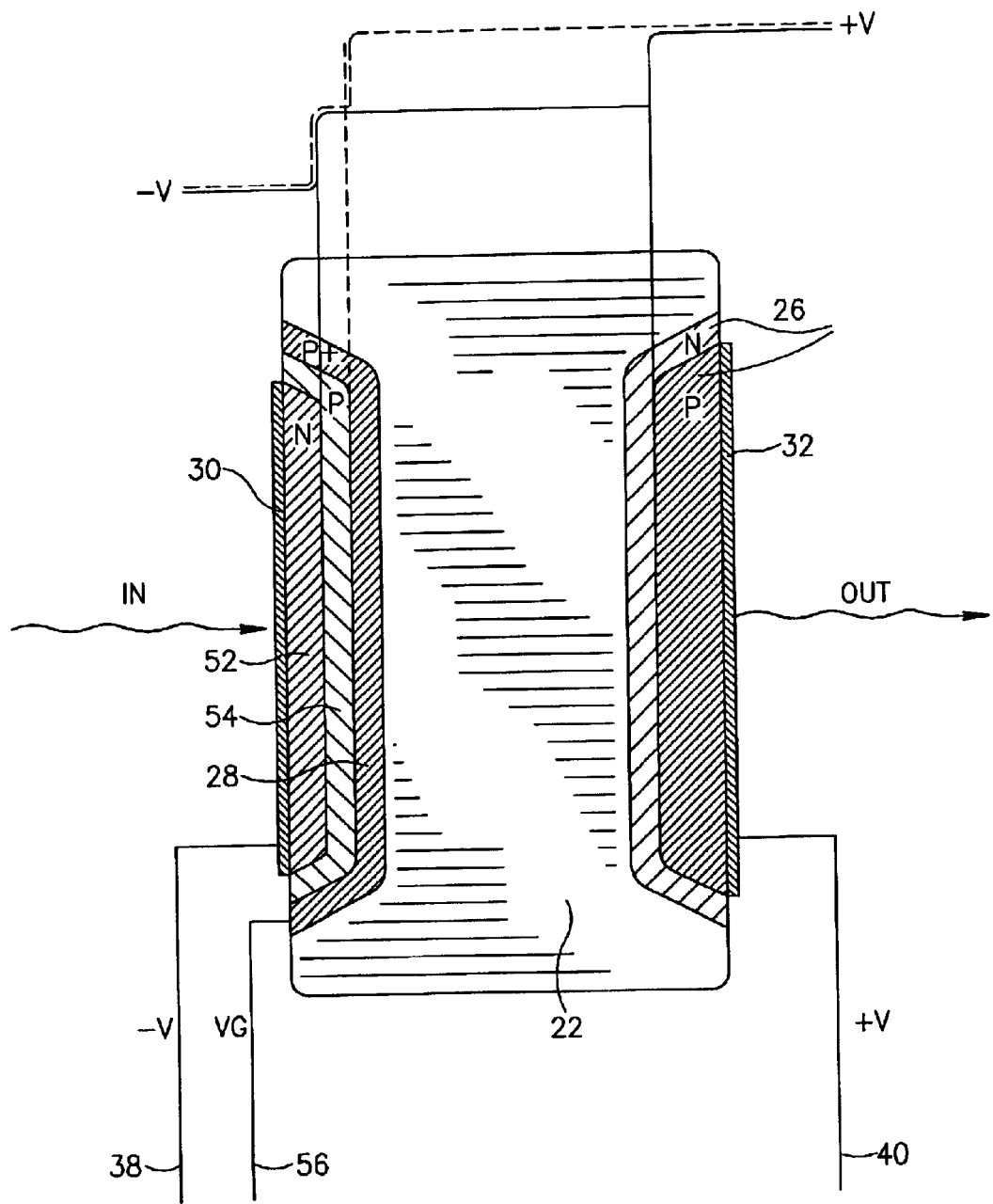
FIG. 5 is a schematic representation of an image detection device in accordance with a preferred embodiment of the invention, in conjunction with which are plotted representative curves of voltage for a transmitting and a non-transmitting state of the shutter.

FIG. 5 shows a schematic voltage diagram of voltage as a function of position across a gate according to the invention, wherein the upper curve represents the voltage where the device is not transmitting (e.g. where the gate voltage is positive) where the lower curve represents the situation where the device is transmitting (e.g. where the gate is grounded or floating).

When optical photons are incident on photodiode layer 24, photoelectrons are generated in the layer. Ordinarily, in the absence of an electrical potential applied between leads 38 and 40, gate layer 28 forms a potential barrier, which prevents these photoelectrons from passing through to substrate 22. The electrons recombine within or adjacent to the photodiode layer. In this state, shutter 20 is effectively closed, and light striking input surface 34 will be substantially prevented from generating light which exits through output surface 36.

To open shutter 20, a voltage, preferably in the range 5 to 15 volts, is applied between leads 40 and 38. Photoelectrons generated in photodiode layer 24 are consequently able to pass the potential barrier of gate layer 28, and are accelerated by the voltage toward LED layer 26. When the electrons reach the LED layer, they recombine, whereupon photons are generated and emitted through output surface 36.

When the shutter is open, the electrons travel ballistically through substrate 22, along a direction substantially parallel to crystal axis 42, with minimal divergence or scattering. Thus, a photon incident at any point on input surface 34 will generally produce a photoelectron that travels straight through substrate 22 and causes a photon to be emitted from a corresponding point on output surface 36. In this manner, if an optical image is focused onto the input surface, it will be reproduced at the output surface when the shutter is open. The resolution of the reproduced image, relative to the input image, will generally be determined by the crystal quality and purity of substrate 22, since imperfections in the crystal will cause electrons to diverge and be scattered as they pass from photodiode 24 to LED 26.

Shutter 20 may be switched rapidly between its open and shut states, with typical transition times of approximately 1 nanosecond or less. Unlike high-speed shutters known in the art, shutter 20 requires no high voltage, and may be switched using TTL-level electrical pulses. It is fabricated using simple, generally inexpensive processes and materials, known in the art, and requires no vacuum sealing. Because of the limited quantum efficiencies of photodiode 24 and LED 26, however, the transmittance of shutter 20 in its open state will be low.

Figure 2:
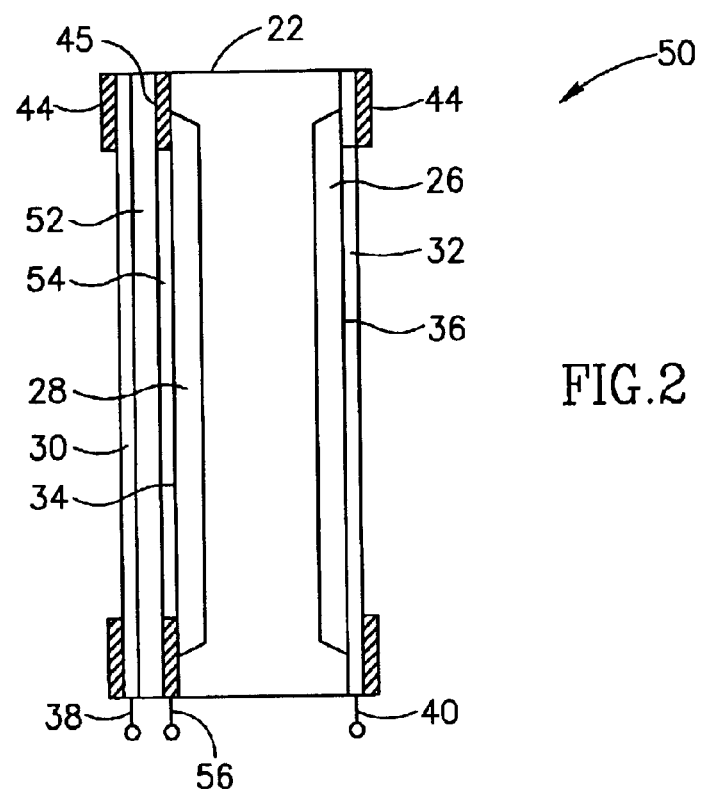
FIG. 2 is a schematic, sectional representation of an intensified optoelectronic shutter, in accordance with another preferred embodiment of the present invention.

FIG. 2 is a schematic, sectional illustration showing an intensified shutter 50, in accordance with an alternative embodiment of the present invention, which overcomes the above-mentioned problem of low transmittance. Shutter 50 is substantially similar to shutter 20 in most aspects of its construction and operation, except that shutter 50 includes a planar avalanche photodiode 52 in place of photodiode layer 24 in shutter 20. For each photon that it absorbs, avalanche photodiode 52 generates a plurality of electrons, typically about one hundred electrons, dependent on biasing of the diode, as described below. The electrons pass through gate 28 to LED layer 26 when the shutter is open, whereupon a plurality of photons are emitted by the LED. Because of this electron multiplication effect, the effective transmittance of shutter 50 is generally close to unity, and may even be greater than unity, i.e., the shutter may intensify an image that is focused onto its input surface. The image transmitted by shutter 50 will typically have added noise relative to the input image, however.

Shutter 50 is preferably produced using methods of semiconductor device fabrication known in the art. Gate layer 28 is produced by doping substrate 22 adjacent to input surface 34, preferably by ion implantation, as described above. A transparent, conductive coating 54 is deposited over surface 34, along with a metal coating 44 in electrical contact with the transparent, conductive coating, on a peripheral portion of the surface. Avalanche photodiode layer 52 is then epitaxially deposited over coating 54 on surface 34, as is known in the art, and outer transparent, conductive coating 30 is deposited over diode layer 52. LED layer 26 and transparent, conductive coating 32 overlaying the LED layer are produced as described above with reference to shutter 20. Other suitable fabrication processes, as known in the art may also be used to fabricate the device.

To operate shutter 50, a reverse biasing voltage in the range of 5 to 40 volts, preferably approximately 100 volts, is applied between a pair of leads 56 and 38, which are coupled to transparent, conducting layers 54 and 30, respectively. At 100 volts reverse bias, the estimated gain of avalanche photodiode 52 will be approximately 100 secondary electrons for every primary photoelectron.

As long as lead 56 and lead 40, coupled to transparent, conducting layer 32, are held at approximately the same potential, however, gate 28 prevents the electrons from reaching LED layer 26. To open shutter 50, a control voltage, preferably in the range 5 to 15 volts, is applied between leads 40 and 56. Under these circumstances, the electrons produced in photodiode layer 52 cross gate 28 and reach LED layer 26, resulting in optical emission therefrom, as described above.

Figure 3:
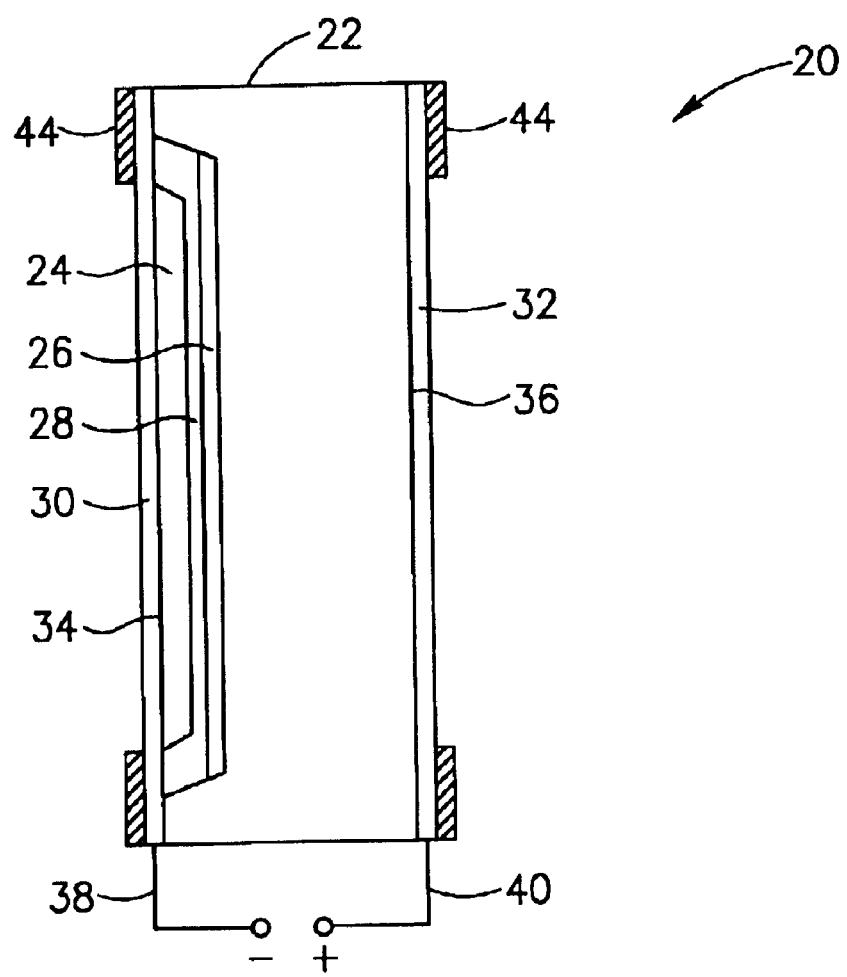
FIG. 3 is a schematic, sectional representation of an optoelectronic shutter, in accordance with still another preferred embodiment of the present invention.

FIG. 3 is a schematic, sectional illustration showing a planar shutter 53, in accordance with another preferred embodiment of the present invention. Shutter 53 is substantially similar to shutter 20, shown in FIG. 1, except that LED layer 26, gate layer 28 and photodiode layer 24 are all produced adjacent to input surface 34 of substrate 22. LED layer 26, at the greatest depth within substrate 22 relative to the input surface, is preferably produced first, followed by gate layer 28 and then photodiode layer 24.

Whereas shutters 20 (FIG. 1) and 50 (FIG. 2) require that doping operations be performed at both input surface 34 and output surface 36, all the doping operations are performed in shutter 53 at the input surface only. Alternatively, the layers may all be produced, in reverse order, at the output surface. Consequently, shutter 53 will be easier and less costly to manufacture than shutters 20 and 50. Furthermore, since photoelectrons emitted by photodiode layer 24 must travel only a short distance through substrate 22 to reach LED layer 26, the divergence and scattering of the electrons will be reduced.

Preferably, after layers 26, 28 and 24 have been produced, substrate 22 is thinned, as is known in the art, so that output surface 36 is brought close to LED layer 26. Thinning the substrate reduces the distance between conductive layer 32 and LED layer 26, so that a relatively lower biasing voltage may be applied between leads 38 and 40. Thinning also reduces the attenuation of light passing through the substrate from LED 26 to output surface 36.

Figure 4A:
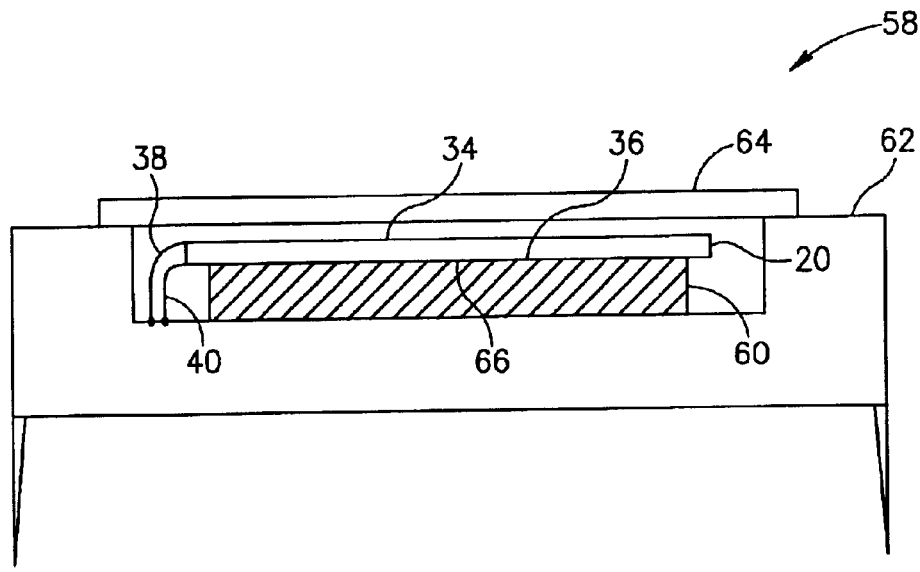
FIG. 4A is a schematic representation of an image detection device, incorporating the shutter of FIG. 1, in accordance with a preferred embodiment of the present invention.

FIG. 4A is a schematic illustration showing an integrated image detection device 58, comprising shutter 20, described above with reference to FIG. 1, and a CCD detector array 60, in accordance with a preferred embodiment of the present invention. Shutter 20 is optically cemented onto front surface 66 of CCD array 60, using optical assembly methods and materials known in the art. Shutter 20 and array 60 are mounted in an integrated circuit package 62 and, preferably, are covered by a window 64. Electrical leads 38 and 40 of shutter 20 are coupled via package 62 (as are the leads of CCD array 60), as is known in the art, to receive control pulses from external circuitry. Thus, for example, device 58 may be incorporated in a CCD camera, in place of a conventional CCD detector array, without modification to the camera optics and with only minor changes to the camera electronics.

Figure 4B:
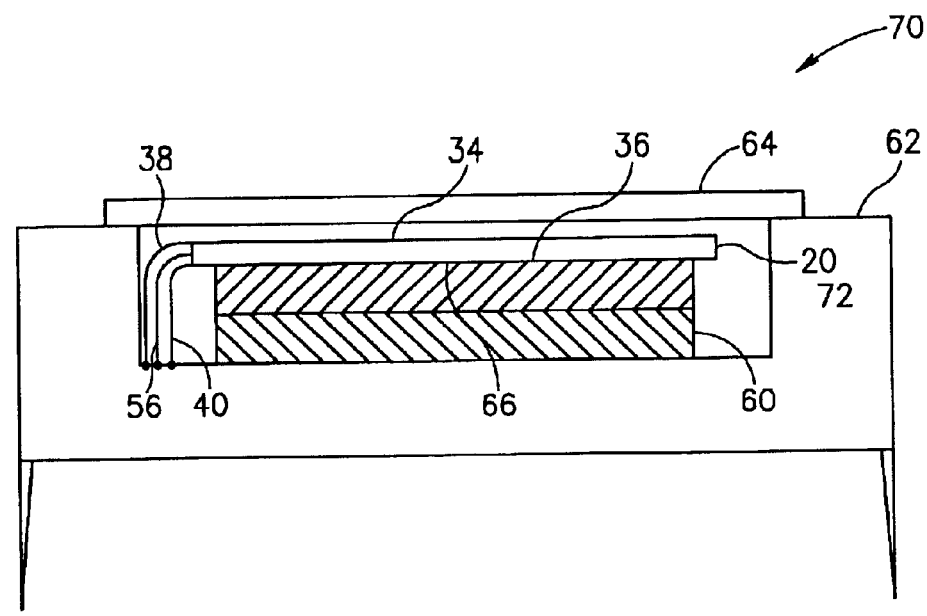
FIG. 4B is a schematic representation of an image detection device, incorporating the shutter of FIG. 2, in accordance with an alternative preferred embodiment of the present invention.

FIG. 4B is a schematic illustration showing another integrated image detection device 70, in accordance with an alternative preferred embodiment of the present invention. In device 70, intensified shutter 50, described above with reference to FIG. 2, is integrated with CCD array 60, as described above with reference to device 58 in FIG. 3. In this case, however, device 70 preferably includes a fiber-optic faceplate 72, intermediate the array and the shutter and optically coupling therebetween, so that the CCD array is isolated from the relatively high voltage present between leads 38 and 56 of the shutter. Shutter 20 may similarly be coupled to array 60 by a faceplate, if desired.

Alternatively, shutter 20 or shutter 50 may be coupled to CCD array 60, or to other detector arrays and image detectors known in the art, by means of an imaging lens that images output surface 36 of the shutter onto the array or detector. In particular, shutter 20 or 50 may be used in high-speed imaging applications and in range-gated and three-dimensional distance-responsive imaging, as described in the above-mentioned PCT patent applications, which are incorporated herein by reference.

In some preferred embodiments of the present invention, photodiode layer 24 of shutter 20 (FIG. 1) or avalanche photodiode layer 52 of shutter 50 (FIG. 2) is sensitive to a radiation wavelength range other than visible radiation, for example, infrared or ultraviolet radiation. In these embodiments, shutter 20 or shutter 50 may be used to up- or down-convert the radiation frequency to the visible range. Additionally, LED layer 26 may be produced, as is known in the art, to emit photons at various wavelengths, from the infrared through the visible range.

In other preferred embodiments of the present invention, shutters in accordance with the principles of the present invention may be used in modulating an image or an array of optically-encoded data, for example, in the framework of a system for optical data processing. Such shutters are advantageous in optically processing the image or the encoded data, since they enable an entire array of data to be optically modulated or switched rapidly, by application of a relatively low-voltage control signal, without the need for complicated or costly optical components.

It will be appreciated that the preferred embodiments described above are cited by way of example, and the full scope of the invention is limited only by the claims.

What is claimed is:

1. A method of producing an optoelectronic circuit comprising:

forming a first optoelectronic element of the circuit on a first surface of a semiconductor substrate;

forming a second optoelectronic element of the circuit on a second surface of the semiconductor substrate; and wherein the first and second optoelectronic elements communicate via current transmitted through the substrate.

2. A method according to claim 1 wherein the semiconductor substrate is a planar substrate.

3. A method according to claim 1 or claim 2 wherein forming the first and second optoelectronic elements comprises doping the first and second surfaces respectively.

4. A method according to claim 1 wherein the semiconductor material of the substrate comprises a material selected from the group consisting of silicon, GaAs and InP.

5. An optoelectronic circuit comprising:

a semiconductor substrate;

a first optoelectronic element of a circuit located on a first surface of the substrate;

a second optoelectronic element of a circuit located on a second surface of the substrate; and a communication link comprising a current path through the substrate via which information is communicated between the first and second optoelectronic elements.

* * * * *